US011264951B2

(12) United States Patent
 Yoshioka

(10) Patent No.: US 11,264,951 B2
(45) Date of Patent: Mar. 1, 2022

(54) AMPLIFIER

(71) Applicant: Mitsubishi Electric Corporation, Tokyo (JP)

(72) Inventor: Takaaki Yoshioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 41 days.

(21) Appl. No.: 16/772,124

(22) PCT Filed: Feb. 9, 2018

(86) PCT No.: PCT/JP2018/004581
 § 371 (c)(1),
 (2) Date: Jun. 11, 2020

(87) PCT Pub. No.: WO2014/155601
 PCT Pub. Date: Aug. 15, 2019

(65) Prior Publication Data
 US 2021/0091723 A1 Mar. 25, 2021

(51) Int. Cl.
 *H03F 3/68* (2006.01)
 *H03F 3/191* (2006.01)
 (Continued)

(52) U.S. Cl.
 CPC .......... *H03F 1/0205* (2013.01); *H03F 1/565* (2013.01); *H03F 3/04* (2013.01); *H03F 2200/222* (2013.01)

(58) Field of Classification Search
 CPC ... H03F 1/56; H03F 3/68; H03F 3/191; H03F 3/193; H03F 1/565; H03F 2200/222
 (Continued)

(56) References Cited

U.S. PATENT DOCUMENTS 4,772,856 A * 9/1988 Nojima ................. H03F 3/211
 327/105
6,060,951 A 5/2000 Inoue
 (Continued)

FOREIGN PATENT DOCUMENTS

JP S63-246013 A 10/1988
JP H04-306906 A 10/1992
 (Continued)

OTHER PUBLICATIONS

International Search Report; Written Opinion; and Notification of Transmittal of the International Search Report and the Written Opinion of the International Searching Authority, or the Declaration issued in PCT/JP2018/004581; dated May 1, 2018.

*Primary Examiner* — Steven J Mottola
(74) *Attorney, Agent, or Firm* — Studebaker & Brackett PC

(57) ABSTRACT

An amplifier includes: a circuit pattern providing a plurality of signal paths having different lengths; a transistor chip; a plurality of pads of transistor cells, the pads being electrically connected to the circuit pattern and being arranged on the transistor chip; a plurality of the transistor cells; a plurality of transmission lines for connecting each of the plurality of pads and each of the plurality of transistor cells, the transmission lines being arranged on the transistor chip, and a plurality of harmonic processing circuits each connected to each of the plurality of transmission lines and arranged on the transistor chip. The plurality of harmonic processing circuits each has a capacitor and an inductor, and a product of the capacitance of the capacitor and the inductance of the inductor is made constant in each of the plurality of harmonic processing circuits.

3 Claims, 11 Drawing Sheets

(51) Int. Cl.
*H03F 1/02* (2006.01)
*H03F 1/56* (2006.01)
*H03F 3/04* (2006.01)

(58) Field of Classification Search
USPC .................. 330/295, 302, 305, 306, 307
See application file for complete search history.

(56) References Cited

U.S. PATENT DOCUMENTS

2007/0024371 A1 2/2007 Gotou et al.
2008/0094141 A1 4/2008 Gotou et al.

FOREIGN PATENT DOCUMENTS

| JP | H11-346130 A | 12/1999 |
| JP | 2003-209447 A | 7/2003 |
| JP | 2007-060616 A | 3/2007 |
| JP | 2008-109227 A | 5/2008 |
| JP | 2013-115491 A | 6/2013 |

\* cited by examiner

AMPLIFIER

FIELD

The present invention relates to an amplifier.

BACKGROUND

In Patent Literature 1, a method for improving the phase deviation and amplitude deviation of a signal which is transmitted to an output terminal connected to each of a plurality of transistor cells, by providing slits on a transmission line connected to the transistor cells is disclosed.

PRIOR ART

Patent Literature

[PTL 1] JP 2013-115491A

SUMMARY

Technical Problem

A high frequency power amplifier disclosed in Patent Literature 1 is subjected to constrain regarding the layout of a transmission line. For example, a metal pattern width, slit width, or the like is subjected to manufacturing constraints. In addition, there has been a problem in which when the number of connection terminals, that is, the number of transistor cells increases, the phase deviation and amplitude deviation of a signal cannot be reduced.

Even if a harmonic processing circuit including a capacitor and an inductor is arranged for each transistor cell in an attempt to improve the phase deviation of a harmonic, the phase deviation of a fundamental wave cannot be improved. In this case, the maximum performance of a transistor cannot be drawn out due to an impedance mismatch caused by the phase deviation of the fundamental wave.

An object of the present invention, which has been made in order to solve the above-mentioned problem, is to provide an amplifier in which performances such as efficiency and gain have been improved.

Means for Solving the Problems

According to a present invention, an amplifier includes a circuit pattern providing a plurality of signal paths having different lengths, a transistor chip, a plurality of pads of transistor cells, the pads being electrically connected to the circuit pattern and being arranged on the transistor chip, a plurality of transistor cells, a plurality of transmission lines for connecting each of the plurality of pads and each of the plurality of transistor cells, the transmission lines being arranged on the transistor chip, and a plurality of harmonic processing circuits each connected to each of the plurality of transmission lines and arranged on the transistor chip, wherein the plurality of harmonic processing circuits each has a capacitor and an inductor, the capacitor and the inductor being connected to a grounding terminal in series, a capacitance of the capacitor is smaller with increasing length of one of the signal paths, the capacitor being connected to the one, and a product of the capacitance of the capacitor and the inductance of the inductor is made constant in each of the plurality of harmonic processing circuits.

Other features will be disclosed below.

Advantageous Effects of Invention

According to this invention, an amplifier in which performances such as efficiency and gain have been improved by adjusting the capacity of a capacitor of a harmonic processing circuit can be provided.

DESCRIPTION OF EMBODIMENTS

Amplifiers according to embodiments of the present invention will be described with reference to drawings. Identical or corresponding components are denoted by identical reference signs and repeated descriptions thereof may be omitted.

First Embodiment

Figure 1:
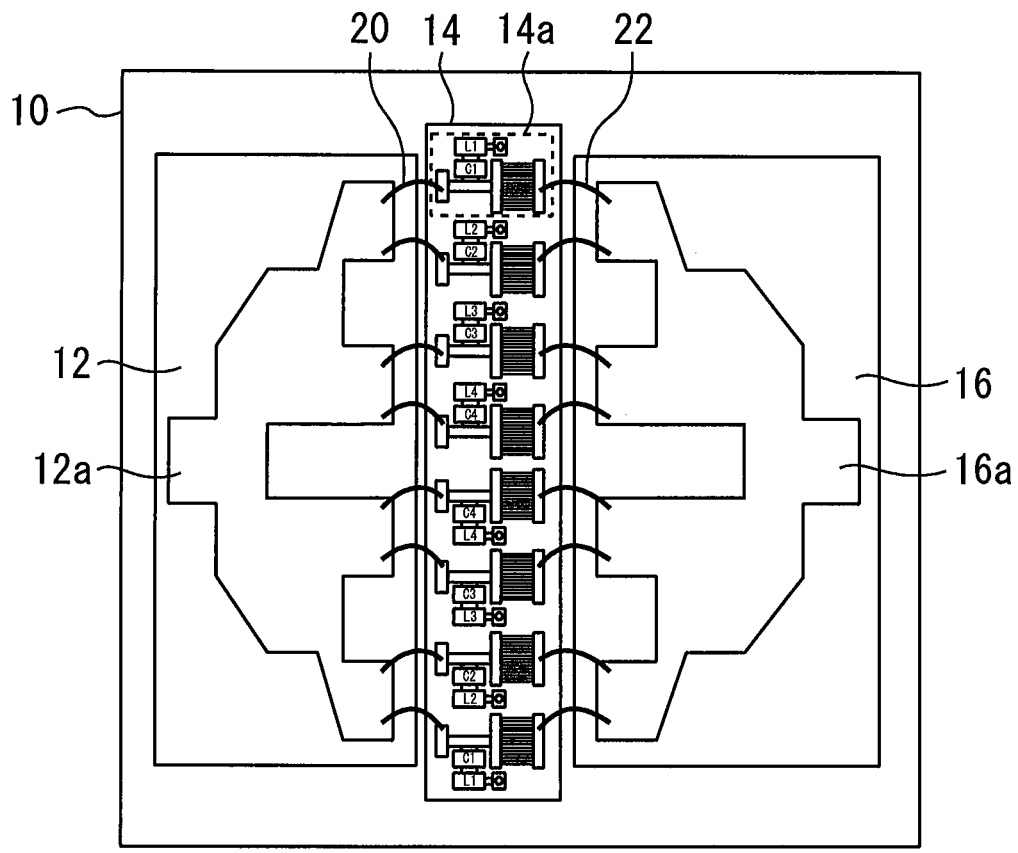
FIG. 1 is an overall view of an amplifier according to a first embodiment.

FIG. 1 is an overall view of an amplifier 10 according to a first embodiment. This amplifier 10 includes: an input matching circuit substrate 12; a transistor chip 14; and an output matching circuit substrate 16. The input matching circuit substrate 12 has a circuit pattern 12a that is formed with a metallized wire. The output matching circuit substrate 16 has a circuit pattern 16a that is formed with a metallized wire. The circuit patterns 12a and 16a are matching circuits. The circuit patterns 12a and 16a provide a plurality of signal paths having different lengths. That is, the circuit pattern 12a has one input end at a left end and has a plurality of output ends at a right end, thereby providing a plurality of signal paths having different lengths. In addition, the circuit pattern 16a has a plurality of input ends at a left end and has one output end at a right end, thereby providing a plurality of signal paths having different lengths.

The transistor chip 14 has a plurality of transistor cells. The transistor cells constitute unit transistor cells. In FIG. 1, one transistor cell 14a out of the plurality of transistor cells is shown by being enclosed by a broken line. In the first embodiment, eight transistor cells are arranged in a line as shown in FIG. 1. The circuit pattern 12a and the transistor cell 14a are connected by a wire 20. The circuit pattern 16a and the transistor cell 14a are connected by a wire 22.

Figure 2:
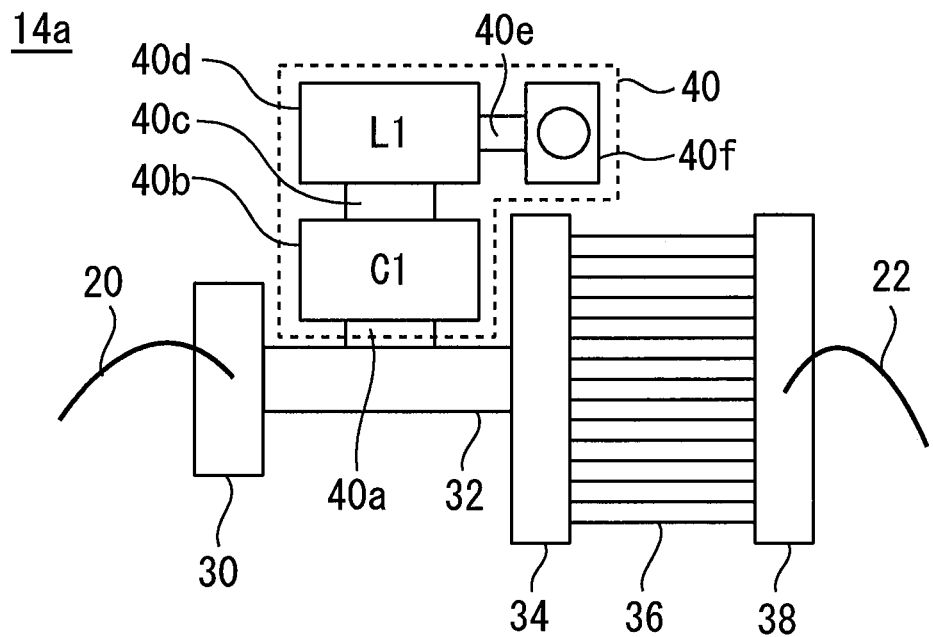
FIG. 2 is an enlarged view of the transistor cell.

FIG. 2 is an enlarged view of the transistor cell 14a. The transistor cell 14a includes a gate pad 30, a transmission line 32, a synthesized line 34, a transistor 36 having a plurality of fingers, and a drain pad 38. The gate pad 30 is connected to the circuit pattern 12a by the wire 20 and the drain pad 38 is connected to the circuit pattern 16a by the wire 22. The gate pad 30 and the transistor 36 are connected by the transmission line 32 and the synthesized line 34.

To the transmission line 32, a harmonic processing circuit 40 is connected. The harmonic processing circuit 40 includes: a transmission line 40a connected to the transmission line 32; a capacitor 40b connected to the transmission line 40a; a transmission line 40c connected to the capacitor 40b; an inductor 40d connected to the transmission line 40c; a transmission line 40e connected to the inductor 40d; and a grounding terminal 40f. The capacitor 40b is, for example, an MIM capacitor. The inductor 40d is, for example, a spiral inductor. The grounding terminal 40f is, for example, formed in a via hole and is a grounded via. The harmonic processing circuit 40 of this embodiment is an LC circuit in which the capacitor 40b and the inductor 40d are connected in series between the transmission line 32 and the grounding terminal 40f. That is, the harmonic processing circuit 40 can be constituted by a resonance circuit.

Figure 3:
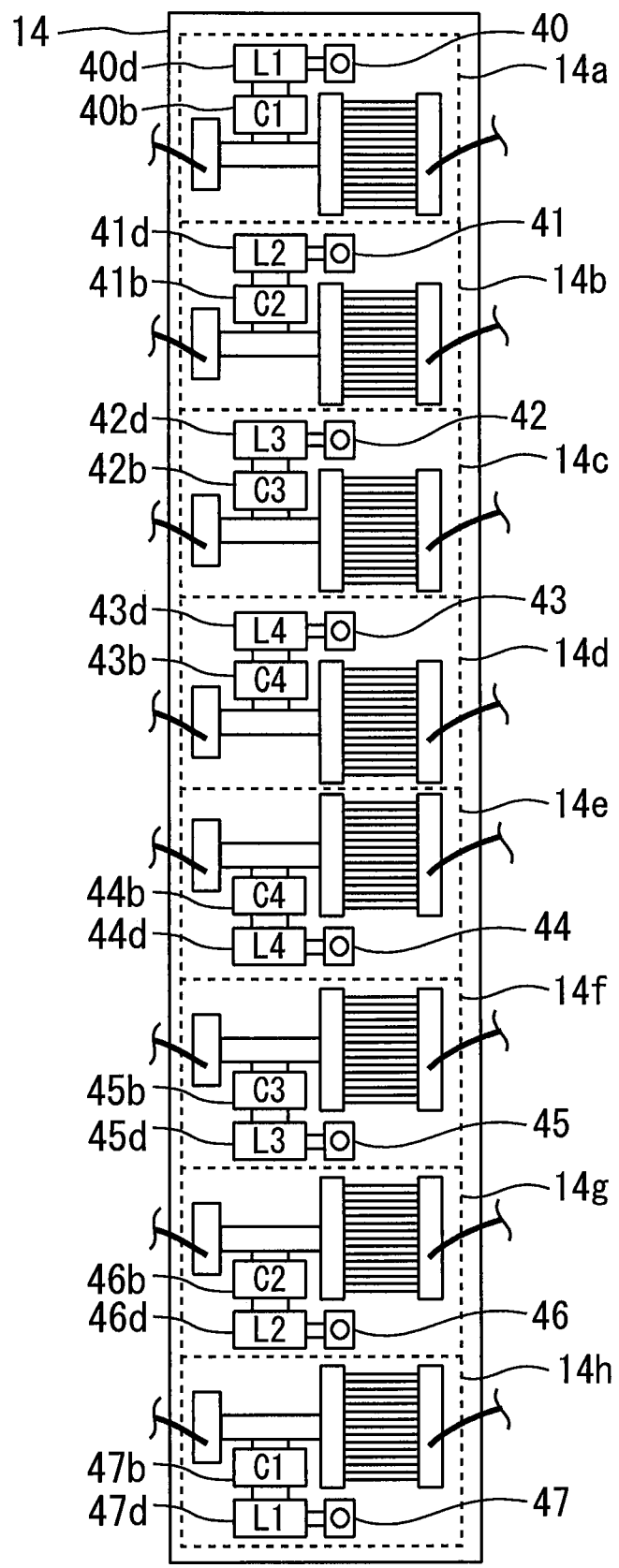
FIG. 3 is an enlarged view of the transistor chip.

FIG. 3 is an enlarged view of the transistor chip 14. The transistor chip 14 of the first embodiment has, as an example, eight transistor cells 14a, 14b, 14c, 14d, 14e, 14f, 14g, and 14h. The transistor cells 14a, 14b, 14c, 14d, 14e, 14f, 14g, and 14h are provided in a line. A basic configuration of each of the transistor cells 14b, 14c, 14d, 14e, 14f, 14g, and 14h is the same as a basic configuration of the transistor cell 14a which is described above. Each of the transistor cells is connected to a different part of the circuit pattern 12a by each of the wires 20, and is connected to a different part of the circuit pattern 16a by each of the wires 22.

The transistor cells 14a, 14b, 14c, 14d, 14e, 14f, 14g, and 14h include the harmonic processing circuit 40, a harmonic processing circuit 41, a harmonic processing circuit 42, a harmonic processing circuit 43, a harmonic processing circuit 44, a harmonic processing circuit 45, a harmonic processing circuit 46, and a harmonic processing circuit 47, respectively. The harmonic processing circuit 40 includes a capacitor 40b having a capacitance of C1 and an inductor 40d having an inductance of L1. The harmonic processing circuit 41 includes a capacitor 41b having a capacitance of C2 and an inductor 41d having an inductance of L2. The harmonic processing circuit 42 includes a capacitor 42b having a capacitance of C3 and an inductor 42d having an inductance of L3. The harmonic processing circuit 43 includes a capacitor 43b having a capacitance of C4 and an inductor 43d having an inductance of L4.

The harmonic processing circuit 44 includes a capacitor 44b having a capacitance of C4 and an inductor 44d having an inductance of L4. The harmonic processing circuit 45 includes a capacitor 45b having a capacitance of C3 and an inductor 45d having an inductance of L3. The harmonic processing circuit 46 includes a capacitor 46b having a capacitance of C2 and an inductor 46d having an inductance of L2. The harmonic processing circuit 47 includes a capacitor 47b having a capacitance of C1 and an inductor 47d having an inductance of L1.

In this embodiment, the above described capacitances satisfy a relation of $C1<C2<C3<C4$. In the circuit pattern 12a in FIG. 1, a length of a signal path from the input end to each of the transistor cells 14a and 14h, a length of a signal path from the input end to each of the transistor cells 14b and 14g, a length of a signal path from the input end to each of the transistor cells 14c and 14f, and a length of a signal path from the input end to each of the transistor cell 14d and 14e increase in this order.

Therefore, a phase of a signal that is transmitted from the circuit pattern 12a to the transistor cells 14a and 14h is larger than a phase of a signal that is transmitted from the circuit pattern 12a to the other transistor cells. To compensate this phase deviation, the capacitance C1 of the capacitors 40b and 47b of the harmonic processing circuits 40 and 47 is made smaller than the capacitances of the other capacitors.

In contrast, a phase of a signal that is transmitted from the circuit pattern 12a to the transistor cells 14d and 14e is smaller than a phase of a signal that is transmitted from the circuit pattern 12a to the other transistor cells. Therefore, the capacitance C4 of the capacitors 43b and 44b of the harmonic processing circuits 43 and 44 is made larger than capacitances of the other capacitors.

In this manner, the capacitance of each of the capacitors is set so as to compensate a signal phase deviation that occurs on the input matching circuit substrate 12. As a result, the above described capacitances satisfy the relation of $C1<C2<C3<C4$. In other words, the capacitance of each of the capacitors is made smaller with increasing length of a signal path to which the capacitor is connected. Therefore, the capacitances of the capacitors are $C1<C2<C3<C4$. It should be note that in FIG. 1, the capacitors having the same capacitance are arranged symmetrically with respect to a center line of the transistor chip 14.

In addition, the product of the capacitance of the capacitor and the inductance of the inductor in each of the plurality of harmonic processing circuits is made constant. That is, under $L1>L2>L3>L4$, $C1 \times L1$, $C2 \times L2$, $C3 \times L3$, and $C4 \times L4$ are made approximately equal. As a result, resonance frequencies of resonance circuits become substantially constant. Thus, the capacitance of the capacitor and inductance of the inductor in the harmonic processing circuit differ for each transistor cell.

As described above, by arranging, for each of the transistor cells, the capacitor having a capacitance value for compensating the phase deviation of a fundamental wave which occurs on the input matching circuit substrate 12, reflection phases of the fundamental wave can be made substantially uniform in all of the transistor cells. By reducing variation in the phase deviation of the fundamental wave irrespective of the number of transistor cells, the maximum performance of all the transistor cells can be drawn out and a high-performance amplifier can be obtained. In addition, by making the resonance frequencies of the resonance circuits constant in all the harmonic processing circuits, reflection phases of a harmonic can also be made uniform.

Figure 4:
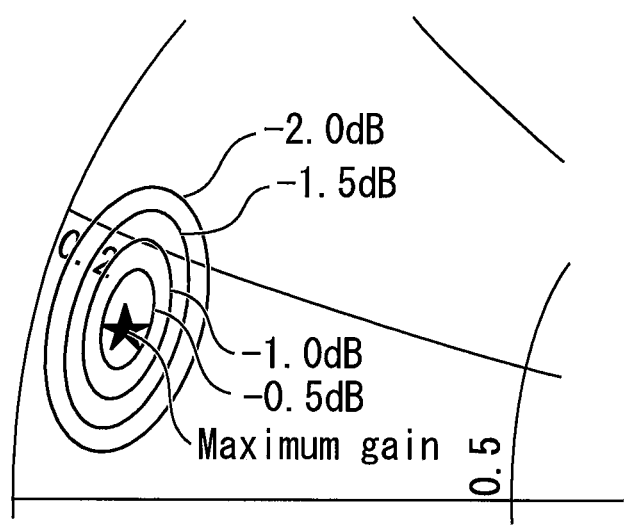
FIG. 4 is a contour map of a gain with respect to a fundamental wave impedance.

Fundamental wave impedance matching will be described in detail. In FIG. 4, an example of a contour map of a gain with respect to a fundamental wave impedance is shown. A point indicated by a star symbol represents a fundamental wave impedance at which a maximum gain can be obtained; and ovals represent contour lines each indicating an amount of gain reduction from the maximum point. That is, when a matching circuit that achieves an impedance at the point indicated by the star symbol is connected to a transistor, the transistor has the maximum gain; and as the impedance deviates from the point indicated by the star symbol, the gain gradually decreases.

Figure 5:
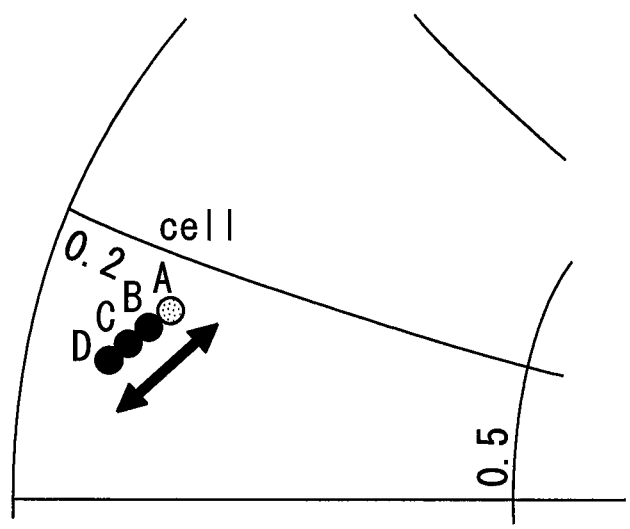
FIG. 5 is a view showing a calculation example of a fundamental wave impedance in a comparative example.

FIG. 5 is a view showing a calculation example of a fundamental wave impedance viewed on a circuit side from each of the transistor cells in a case where the present invention is not applied. In this calculation example, a line length from a signal input end of a high frequency power amplifier to an input end of a transistor cell is different for each transistor cell and therefore, variations have occurred in an impedance viewed on the circuit side from the each transistor cell.

Figure 6:
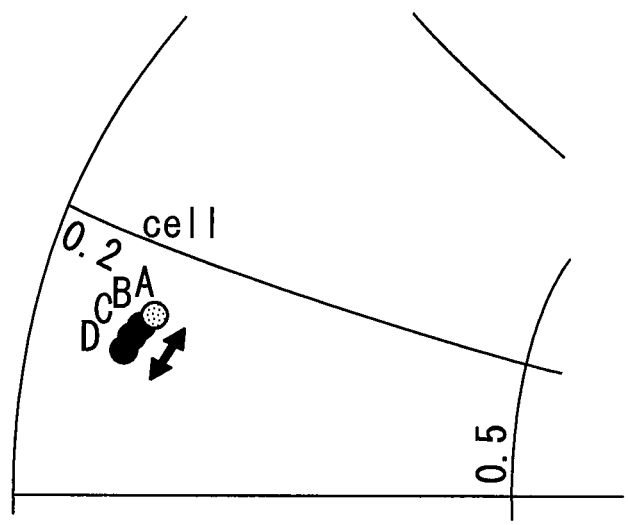
FIG. 6 shows a calculation example of a fundamental wave impedance viewed on a circuit side from each of the transistor cells in the amplifier of the first embodiment.

FIG. 6 shows a calculation example of a fundamental wave impedance viewed on a circuit side from each of the transistor cells in the amplifier of the first embodiment. By compensating a mismatch of a fundamental wave for each of the transistor cells by using the harmonic processing circuits, the impedance viewed on the circuit side from each of the transistor cells can be matched to an adjacency of the fundamental wave impedance where the maximum gain shown in FIG. 4 can be obtained, in all of the transistor cells. Thus, a higher-gain amplifier can be obtained in comparison with the case where the present invention is not applied. In addition, by eliminating an imbalance between cells on an input side, such effects that output power and efficiency are improved can be obtained.

Figure 7:
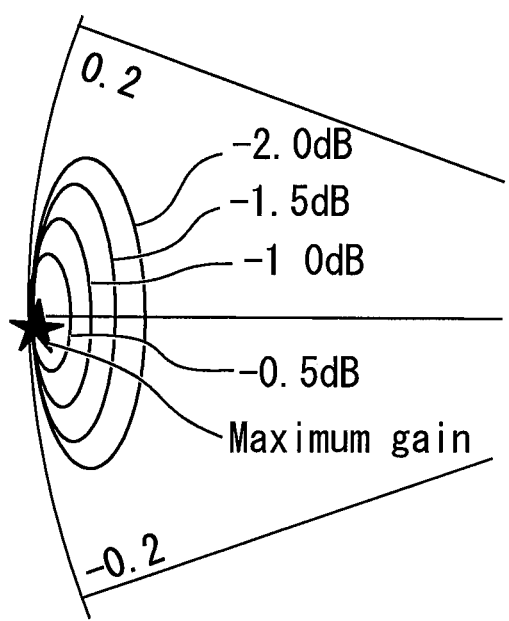
FIG. 7 is a contour map of a gain with respect to a second harmonic impedance.

Next, second harmonic impedance matching will be described in detail. In FIG. 7, an example of a contour map of a gain with respect to a second harmonic impedance is shown. A point indicated by a star symbol is a second harmonic impedance at which a maximum gain can be obtained; and ovals are contour lines each indicating an amount of gain reduction from the maximum point.

Figure 8:
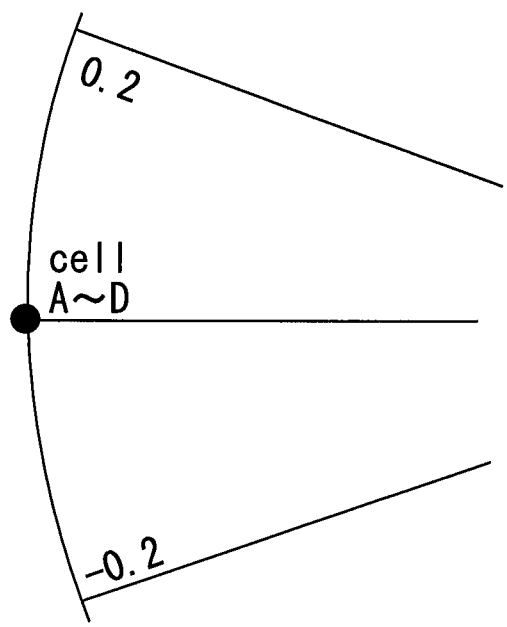
FIG. 8 shows a calculation example of a second harmonic impedance in a comparative example.

In FIG. 8, a calculation example of a second harmonic impedance viewed on a circuit side from each transistor cell in a case where the present invention is not applied is shown. A resonance frequency of a resonance circuit consisting of a capacitor and an inductor is set to twice the operation frequency of a high-frequency power amplifier and thereby, a short-circuit point for a second harmonic is formed in all of the transistor cells. In this situation, when specifications of a harmonic processing circuit are changed, a second harmonic impedance viewed on the circuit side from each of the transistor cells varies. In this case, however, by setting capacitance and inductance so that Cn×Ln (n=1 to 4) is constant in any of the resonance circuits, influences on second harmonic matching are prevented from occurring.

Figure 9:
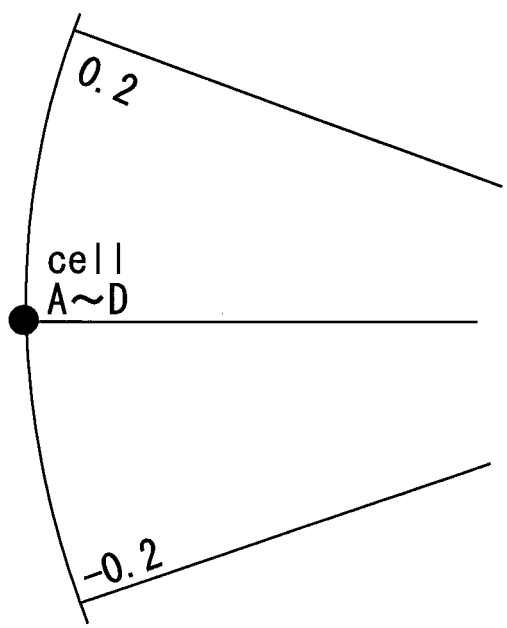
FIG. 9 shows a calculation example of a second harmonic impedance viewed on the circuit side from each of the transistor cells in the amplifier of the first embodiment.

FIG. 9 shows a calculation example of a second harmonic impedance viewed on the circuit side from each of the transistor cells in the amplifier of the first embodiment. The second harmonic impedance viewed on the circuit side from each of the transistor cells is maintained to be the impedance in a case where the present invention is not applied. That is, a mismatch from an optimum load for a second harmonic is prevented from occurring and therefore, performance deterioration due to specification changes of the harmonic processing circuits is not caused.

Thus, the amplifier according to the first embodiment can reduce the phase deviations of both the signals of a fundamental wave and harmonic even in a situation where the number of connection terminals on the matching circuit substrates, that is, the number of transistor cells has increased. As a result, an impedance mismatch that occurs for each of the transistor cells can be minimized and a higher-performance amplifier in which efficiency, gain, and the like are increased can be obtained. In the first embodiment, a transistor chip in which eight transistor cells are arranged is used as an amplifier element; however, it does not necessarily require eight transistor cells. In addition, in the first embodiment, the harmonic processing circuits are arranged on the transistor chip 14; however, the harmonic processing circuits may be arranged on the matching circuit substrates as long as the harmonic processing circuits can be arranged one to one for each of the transistor cells. Further, the numbers of matching circuit substrates and transistor chips may be changed. The matching circuit substrates may be arranged inside a package or may be arranged outside a package.

Modifications mentioned in the first embodiment can be also applied to subsequent embodiments. It should be noted that the amplifiers according to the following embodiments have a lot of similarities to the first embodiment and therefore, differences from the first embodiment will be mainly described.

Second Embodiment

Figure 10:
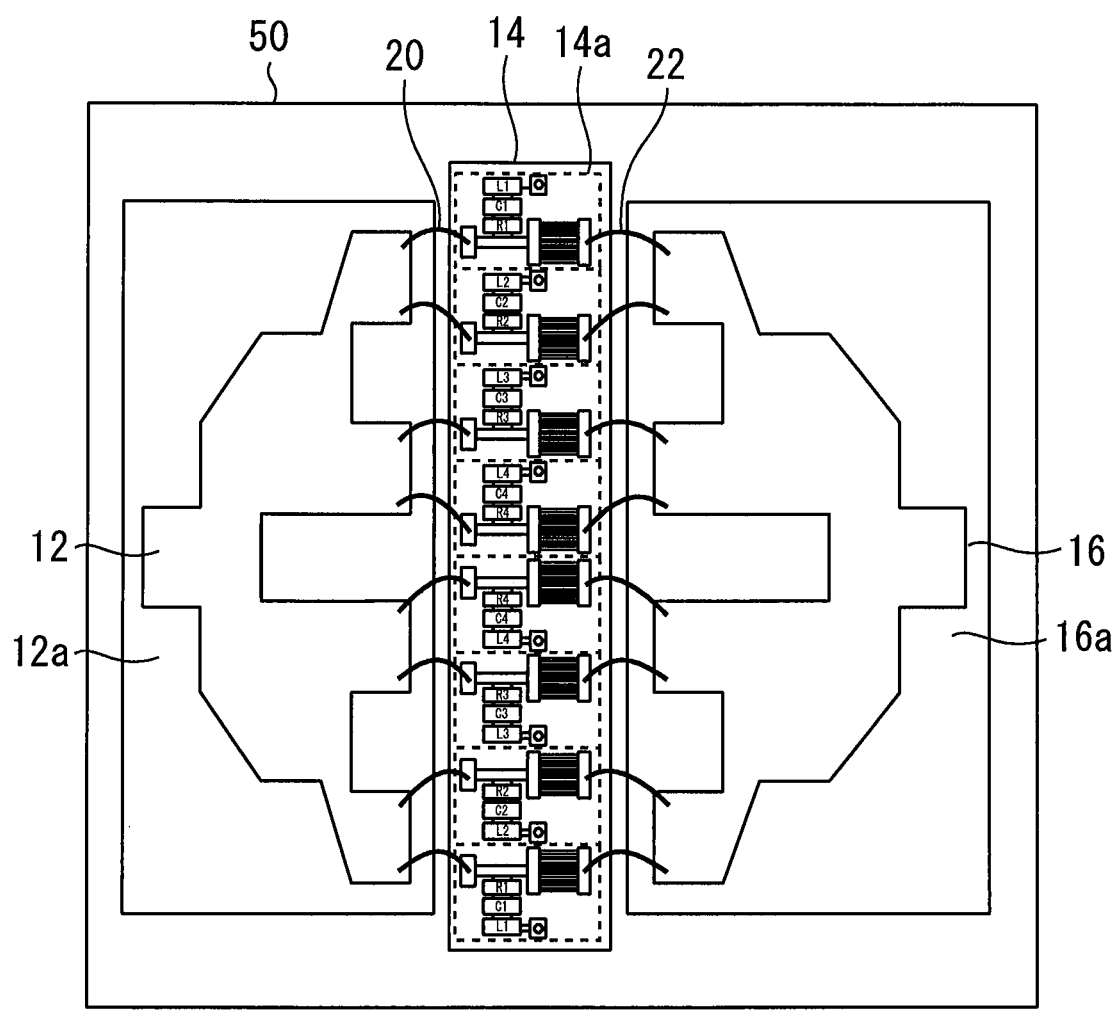
FIG. 10 is an overall view of an amplifier according to a second embodiment.

FIG. 10 is an overall view of an amplifier 50 according to a second embodiment. A harmonic processing circuit of the second embodiment has a resistor in addition to the capacitor and the inductor. The capacitance value of the capacitor and the inductance of the inductor can be set similarly to the first embodiment.

Figure 11:
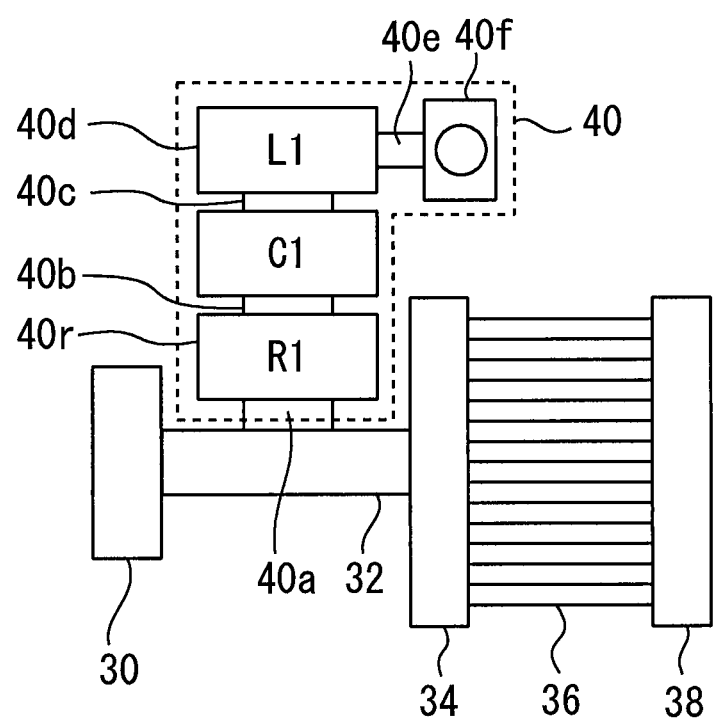
FIG. 11 is an enlarged view of the transistor cell.

FIG. 11 is an enlarged view of a transistor cell 14a in FIG. 10. In a midway of the transmission line 40a, an in-circuit resistor 40r is provided. The in-circuit resistor 40r is shunt-connected to the transmission line 32.

Figure 12:
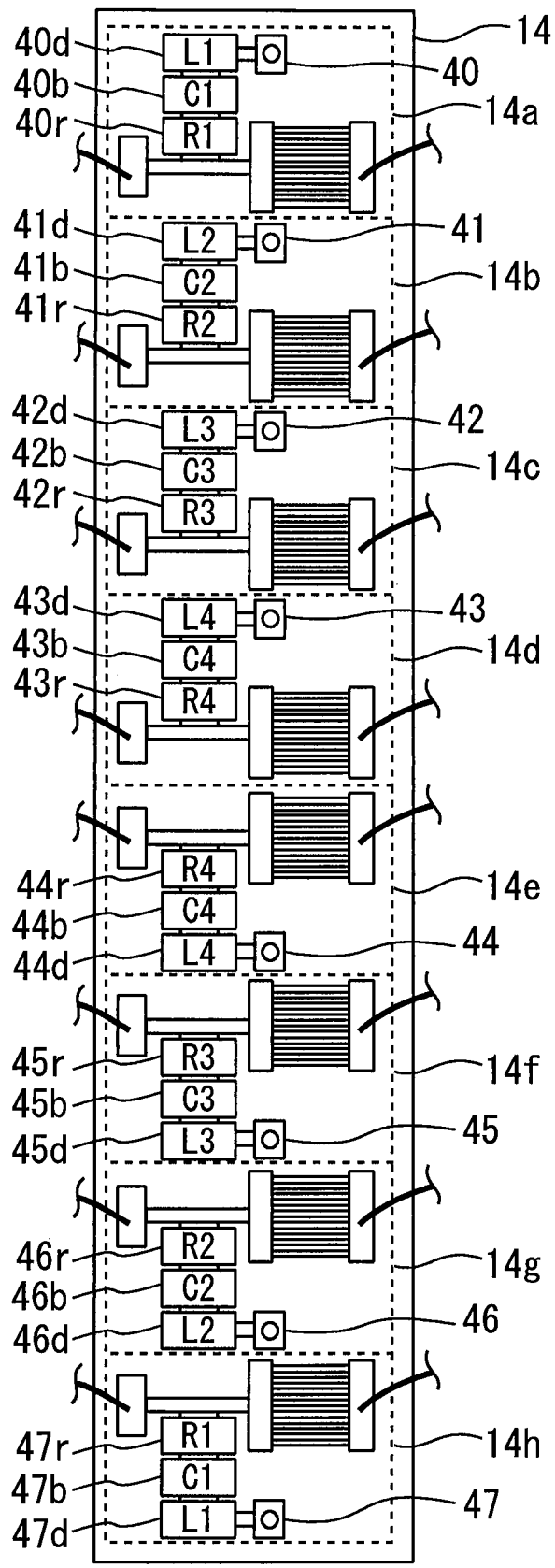
FIG. 12 is an enlarged view of the transistor chip.

FIG. 12 is an enlarged view of a transistor chip 14 in FIG. 10. The harmonic processing circuits include respective in-circuit resistors 40r, 41r, 42r, 43r, 44r, 45r, 46r, and 47r. The resistance values of the in-circuit resistors 40r, 41r, 42r, 43r, 44r, 45r, 46r, and 47r are R1, R2, R3, R4, R4, R3, R2, and R1, respectively. The resistance value of each of the in-circuit resistors satisfies R1>R2>R3>R4. That is, the resistance value of each of the in-circuit resistors is made larger with increasing length of a corresponding signal path. In other words, the resistance value of each of the in-circuit resistors is larger with increasing length of a signal path to which the in-circuit resistor is connected. Therefore, a signal amplitude deviation due to a resistance difference between the signal paths can be compensated by the in-circuit resistors.

For each of the transistor cells, the capacitor having a capacitance value for compensating the phase deviation of a fundamental wave which occurs on the input matching circuit substrate 12 is arranged and in addition, the in-circuit resistor having a resistance value for compensating the amplitude deviation is arranged. As a result, the reflection phases and reflection amplitudes of a fundamental wave can be made uniform in all of the transistor cells. In addition, by making the resonance frequencies of the resonance circuits constant in all the harmonic processing circuits, the reflection phases of a harmonic can also be made uniform.

In the amplifier 50 according to the second embodiment, the phase deviation and amplitude deviation of a fundamental wave can be reduced irrespective of the number of transistor cells. Therefore, the maximum performance of all the transistor cells can be drawn out more than in the first embodiment and a higher-performance amplifier can be obtained.

Third Embodiment

Figure 13:
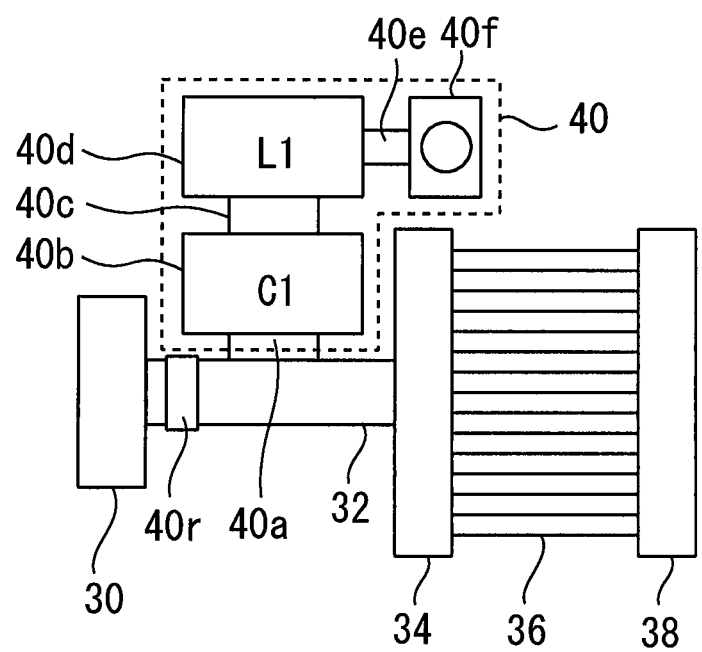
FIG. 13 is a view showing a transistor cell included in an amplifier according to a third embodiment.

FIG. 13 is a view showing a transistor cell included in an amplifier according to a third embodiment. The amplifier according to the third embodiment is basically the same as the amplifier of the second embodiment but is different in the arrangement position of a resistor. The transistor cell according to the third embodiment includes, as shown in FIG. 13, a line resistor 40r on the transmission line 32 instead of having an in-circuit resistor.

Figure 14:
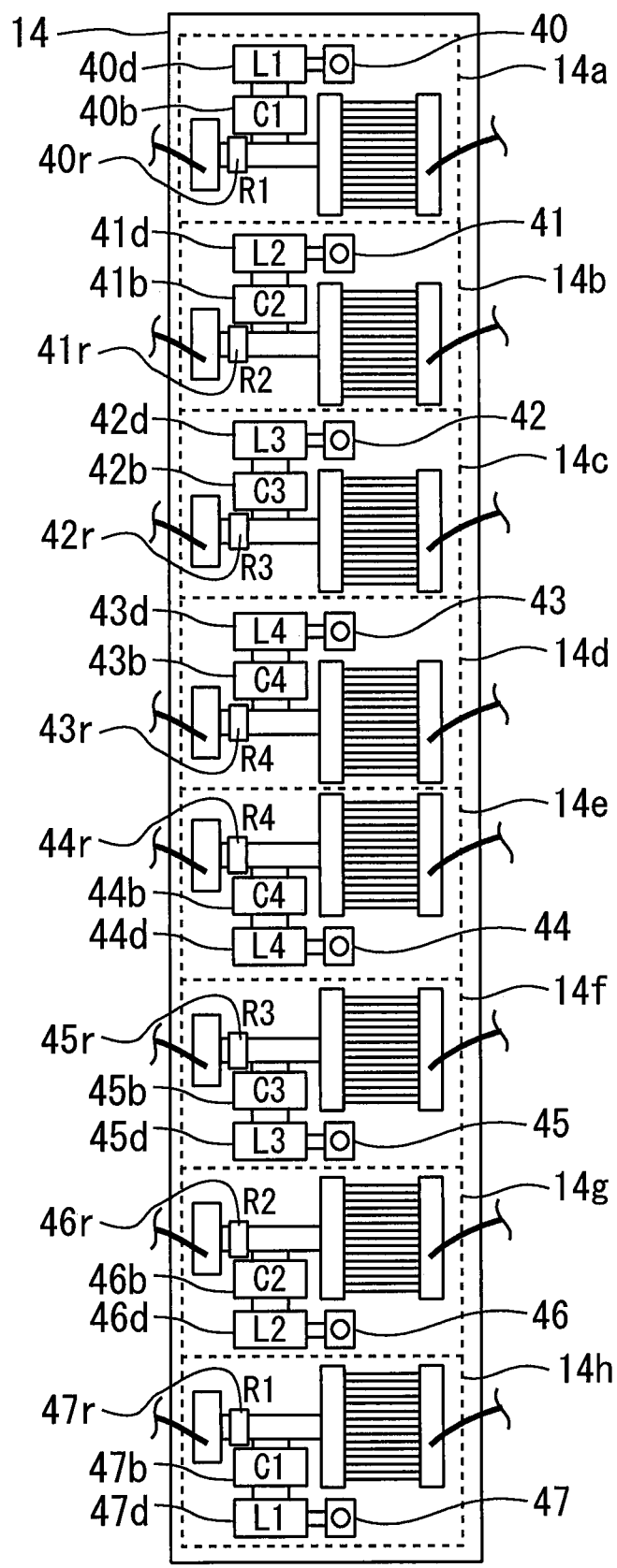
FIG. 14 is an enlarged view of the transistor chip.

FIG. 14 is an enlarged view of a transistor chip 14 according the third embodiment. Harmonic processing circuits 40, 41, 42, 43, 44, 45, 46, and 47 include line resistors 40r, 41r, 42r, 43r, 44r, 45r, 46r, and 47r, respectively. The resistance values of the line resistors 40r, 41r, 42r, 43r, 44r, 45r, 46r, and 47r are R1, R2, R3, R4, R4, R3, R2, and R1, respectively. The resistance value of each of the line resistors satisfies R1<R2<R3<R4. That is, the resistance value of each of the line resistors is made smaller with increasing length of a corresponding signal path. In other words, the resistance value of each of the line resistors is smaller with increasing length of a signal path to which the line resistor is connected. Therefore, a signal amplitude deviation that occurs on the input matching circuit substrate 12 can be compensated by the line resistors.

Thus, at least one of the line resistors is provided on each of the transmission lines. In addition, by adjusting its resistance value as described above, effects similar to those in the second embodiment can be obtained. Further, by arranging the resistors on the transmission lines, a reduction in the reflection amplitude of a harmonic can be prevented and therefore, a higher performance amplifier can be obtained.

Fourth Embodiment

Figure 15:
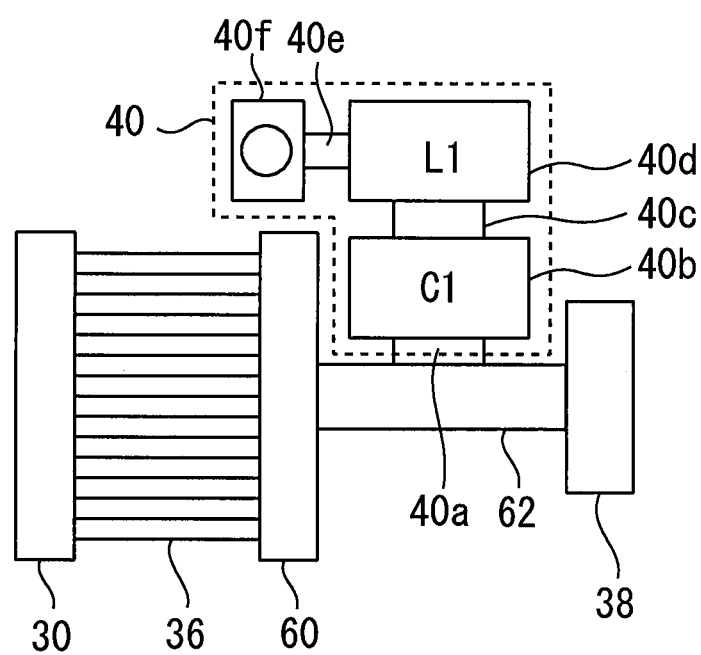
FIG. 15 is a view showing a transistor cell included in the amplifier according to the fourth embodiment.

An amplifier according to a fourth embodiment is configured and operates similarly to the first embodiment except the arrangement position of a harmonic processing circuit. FIG. 15 is a view showing a transistor cell included in the amplifier according to the fourth embodiment. The drain pad 38 and the transistor 36 are connected by a synthesized line 60 and a transmission line 62. To the transmission line 62, a harmonic processing circuit 40 is connected. The harmonic processing circuit 40 can be the same circuit as the harmonic processing circuit 40 in FIG. 2. In addition, in each of the transistor cells, the harmonic processing circuit is connected on the transmission line for connecting the drain pad and the transistor. The capacitance of a capacitor and the inductance of an inductor in the harmonic processing circuit can be set similarly to the first embodiment.

The operation and effects of an amplifier like this can be considered similarly to the amplifier of the first embodiment. The efficiency or output of a transistor gradually decreases according to a deviation of the impedance of a matching circuit connected to the transistor from an optimum load. By compensating a mismatch of a fundamental wave for each of the transistor cells by using the harmonic processing circuit, the impedance viewed on the circuit side from each of the transistor cells can be matched to an adjacency of a fundamental wave impedance where a maximum efficiency or maximum output can be obtained, in all of the transistor cells. Thus, a higher-efficiency and higher-output amplifier can be obtained in comparison with a case where the present invention is not applied.

On the transmission line for connecting the drain pad and the transistor, the harmonic processing circuit of the second embodiment may be connected or the harmonic processing circuit and line resistor of the third embodiment may be provided. On each of a plurality of the transmission lines for connecting each of pads which are electrically connected to either of two circuit patterns 12a and 16a, that is, gate pads or drain pads, with each of the plurality of transistor cells, each one of the above-mentioned harmonic processing circuits can be connected. The characteristics of the amplifiers according to the embodiments described above can be combined.

DESCRIPTION OF SYMBOLS

The description of symbols is as follows: 10 amplifier, 12 input matching circuit substrate, 14 transistor chip, and 16 output matching circuit substrate.

The invention claimed is:
1. An amplifier, comprising:
a circuit pattern providing a plurality of signal paths having different lengths;
a transistor chip;
a plurality of pads for transistor cells, the pads being electrically connected to the circuit pattern and being arranged on the transistor chip;
a plurality of the transistor cells;
a plurality of transmission lines for connecting each of the plurality of pads and each of the plurality of transistor cells, the transmission lines being arranged on the transistor chip; and
a plurality of harmonic processing circuits each connected to each of the plurality of transmission lines and arranged on the transistor chip, wherein
the plurality of harmonic processing circuits each has a capacitor and an inductor, the capacitor and the inductor being connected to a grounding terminal in series,
a capacitance of the capacitor is smaller with increasing length of one of the signal paths, the capacitor being connected to the one, and
a product of the capacitance of the capacitor and the inductance of the inductor is made constant in each of the plurality of harmonic processing circuits.
2. The amplifier according to claim 1, wherein
the plurality of harmonic processing circuits each includes an in-circuit resistor; and
a resistance value of the in-circuit resistor is larger with increasing length of one of the signal paths, the in-circuit resistor being connected to the one.
3. The amplifier according to claim 1, comprising:
a plurality of line resistors, at least one of the line resistors being provided on each of the plurality of transmission lines; and
a resistance value of the at least one line resistor is smaller with increasing length of one of the signal paths, the at least one line resistor being connected to the one.

* * * * *